(12) United States Patent
Fuse et al.

(10) Patent No.: US 10,121,664 B2
(45) Date of Patent: Nov. 6, 2018

(54) DOPANT INTRODUCTION METHOD AND HEAT TREATMENT METHOD

(71) Applicant: SCREEN HOLDINGS CO., LTD., Kyoto-shi, Kyoto (JP)

(72) Inventors: Kazuhiko Fuse, Kyoto (JP); Hideaki Tanimura, Kyoto (JP); Shinichi Kato, Kyoto (JP)

(73) Assignee: Screen Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/819,943

(22) Filed: Nov. 21, 2017

(65) Prior Publication Data

US 2018/0166281 A1 Jun. 14, 2018

(30) Foreign Application Priority Data

Dec. 12, 2016 (JP) .................................. 2016-240162

(51) Int. Cl.
*H01L 21/225* (2006.01)
*H01L 21/02* (2006.01)
*H01L 21/324* (2006.01)
*H01L 21/67* (2006.01)

(52) U.S. Cl.
CPC .... *H01L 21/2256* (2013.01); *H01L 21/02129* (2013.01); *H01L 21/324* (2013.01); *H01L 21/67115* (2013.01)

(58) Field of Classification Search
CPC combination set(s) only.
See application file for complete search history.

(56) References Cited

U.S. PATENT DOCUMENTS

| 8,962,369 B2 | 2/2015 | Loo et al. | |
| 2004/0023472 A1* | 2/2004 | Niwayama | H01L 21/324 |
| | | | 438/542 |
| 2009/0311840 A1* | 12/2009 | Onizawa | H01L 21/268 |
| | | | 438/287 |
| 2015/0206751 A1* | 7/2015 | Kato | H01L 21/228 |
| | | | 438/542 |

FOREIGN PATENT DOCUMENTS

JP 2007-201337 A 8/2007

OTHER PUBLICATIONS

Office Action issued in corresponding Taiwanese Patent Application No. 106135598, dated Jun. 4, 2018 (w/partial English translation).

* cited by examiner

*Primary Examiner* — Mamadou Diallo
(74) *Attorney, Agent, or Firm* — McDermott Will & Emery LLP

(57) ABSTRACT

A thin film containing a dopant is deposited on a surface of a semiconductor wafer. The semiconductor wafer on which the thin film containing the dopant is deposited is rapidly heated to a first peak temperature by irradiation with light from halogen lamps, so that the dopant is diffused from the thin film into the surface of the semiconductor wafer. The thermal diffusion using the rapid heating achieves the introduction of the necessary and sufficient dopant into the semiconductor wafer without producing defects. The surface of the semiconductor wafer is heated to a second peak temperature by further irradiating the semiconductor wafer with flashes of light from flash lamps, so that the dopant is activated. The flash irradiation which is extremely short in irradiation time achieves a high activation rate without excessive diffusion of the dopant.

5 Claims, 14 Drawing Sheets

F I G . 4
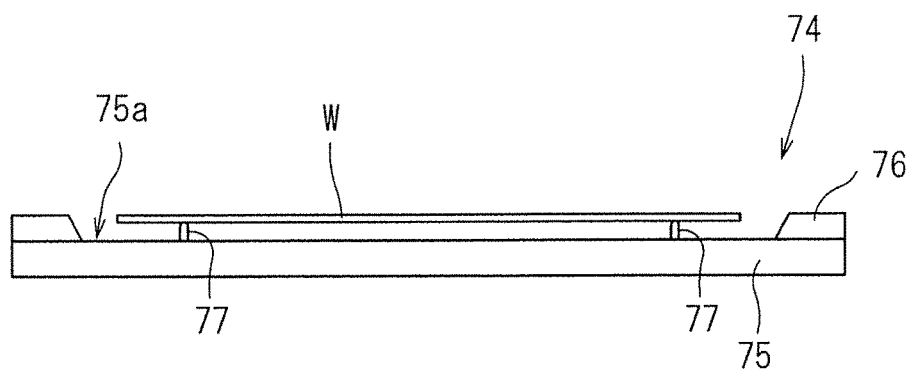

F I G. 6
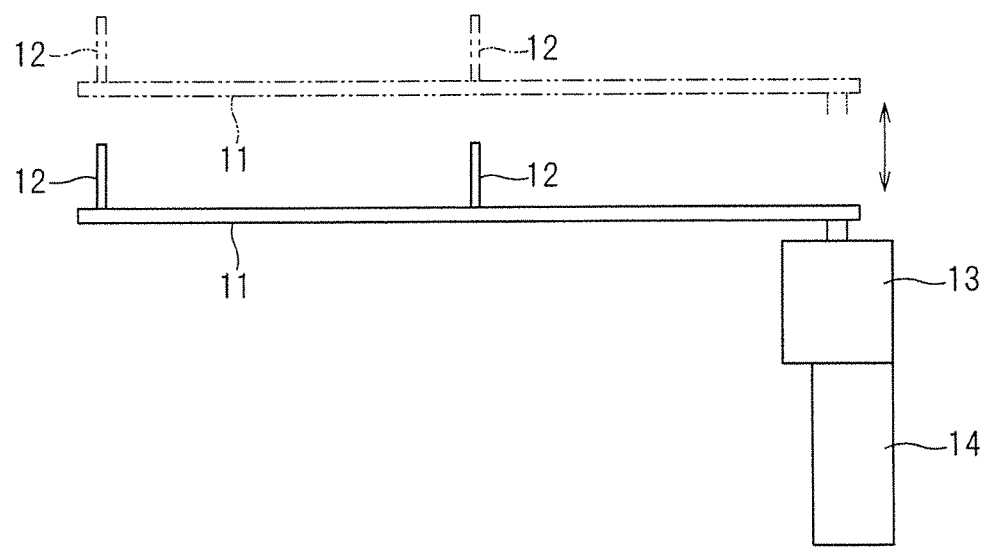

F I G. 7
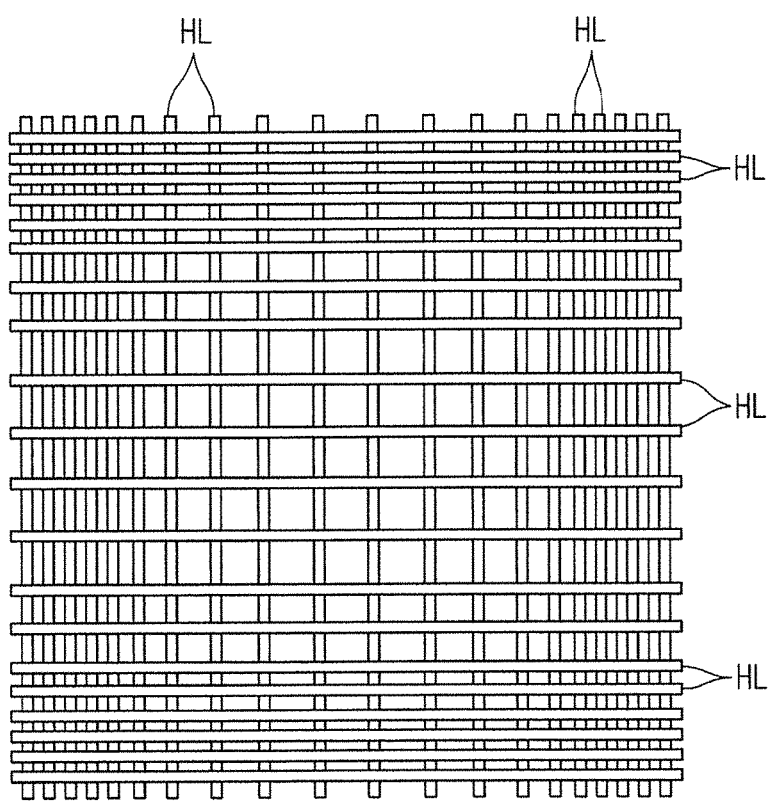

F I G. 9
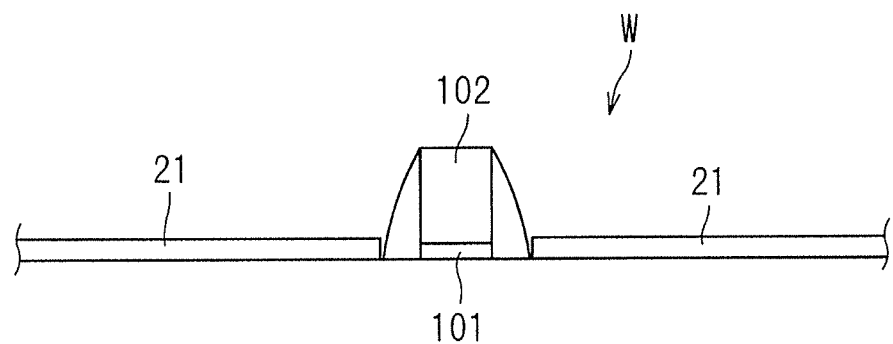

F I G. 1 1
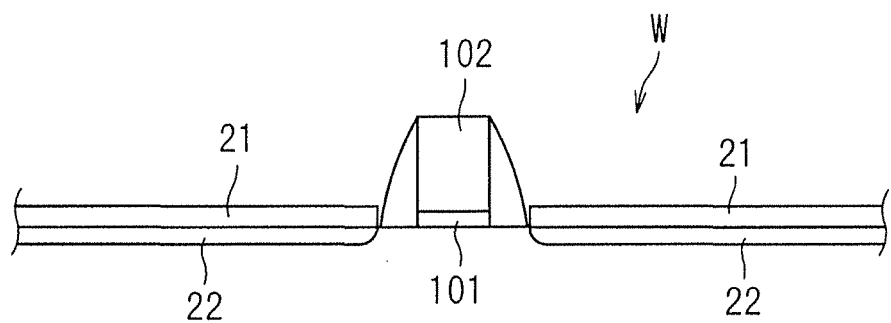

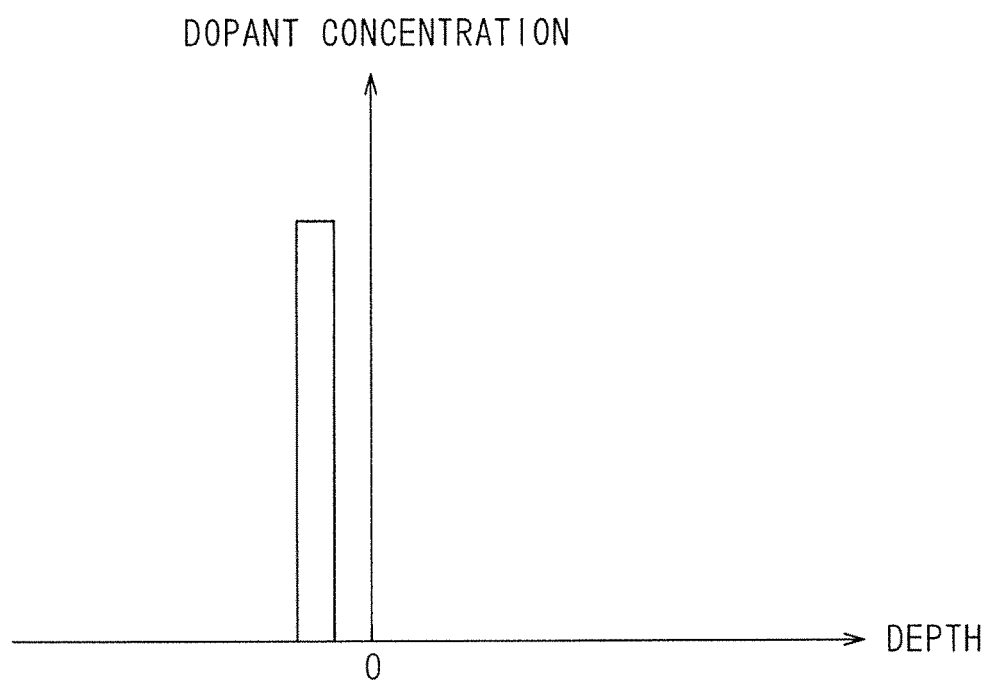
F I G . 1 2

F I G . 1 4
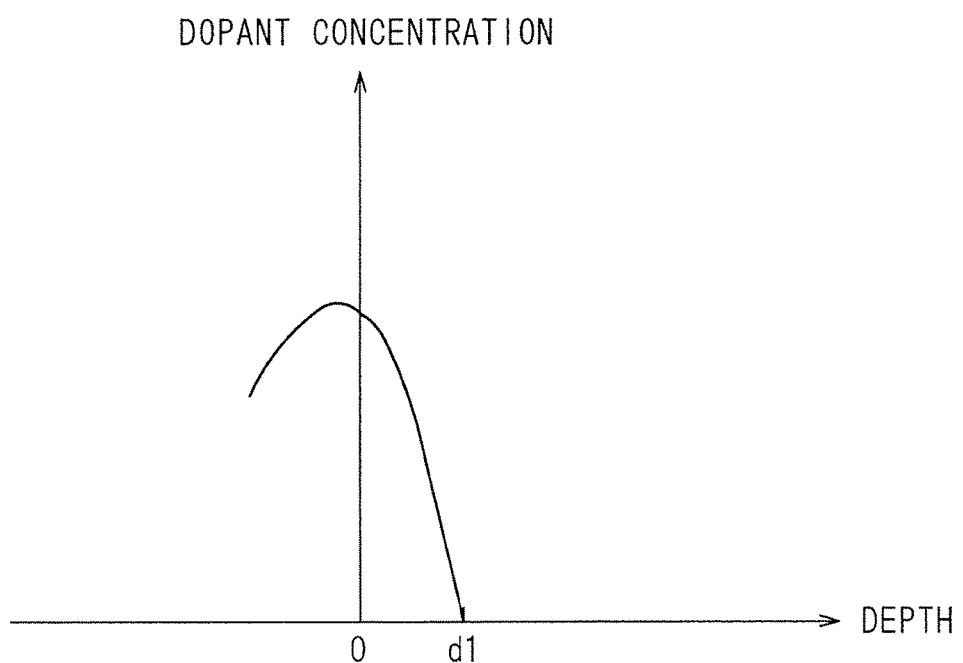

DOPANT INTRODUCTION METHOD AND HEAT TREATMENT METHOD

BACKGROUND OF THE INVENTION

Field of the Invention

The present invention relates to a dopant introduction method and a heat treatment method which introduce a dopant into a semiconductor substrate to activate the dopant.

Description of the Background Art

In the process of manufacturing a semiconductor device, the introduction of a dopant into monocrystalline silicon or germanium is an essential step. An n-type semiconductor or a p-type semiconductor is produced by the introduction of a dopant. The introduction of a dopant is typically achieved by ion-implanting dopant atoms such as boron (B), arsenic (As) and phosphorus (P) into a semiconductor substrate of silicon and the like and then performing an annealing process on the semiconductor substrate to activate the dopant atoms.

In recent years, an attempt has been made to improve device performance by changing a conventional planar device structure to a three-dimensional structure (for example, a FinFET). In such a three-dimensional structure, it is difficult for a conventionally dominant ion implantation method to implant a dopant into a required location in some cases. The ion implantation also has the problem of damaging the inside of the semiconductor substrate during the implantation to produce crystal defects. To solve the problem, a dopant introduction technique different from the ion implantation has been proposed (for example, Japanese Patent Application Laid-Open No. 2007-201337). This dopant introduction technique includes the steps of depositing a thin film of an oxide doped with a dopant such as boron and phosphorus (a PSG film, a BSG film and the like) on a semiconductor substrate, and then performing an annealing process on the semiconductor substrate on which the thin film is deposited to diffuse the dopant atoms from the thin film into the semiconductor.

With the advancement of semiconductor technology, there has been a need for processes with a smaller heat capacity. For example, heat treatment processes for an extremely short time period on the order of milliseconds or nanoseconds such as flash lamp annealing (FLA) have been predominant. Unfortunately, a native oxide film is inevitably formed on the surface of the semiconductor substrate at the time of the deposition of the PSG film or the like. It is difficult for such heat treatment processes for an extremely short time period such as flash lamp annealing to diffuse the sufficient dopant from the film containing the dopant through the oxide film into the semiconductor substrate.

Spike RTA (Rapid Thermal Annealing) that is a longer-time heat treatment process than the flash lamp annealing can be used to diffuse the dopant through the oxide film into the semiconductor substrate, but presents the problem of the low activation rate of the diffused dopant. In addition, there is a danger that the spike RTA causes the dopant to diffuse from the surface of the semiconductor substrate to an excessive depth.

SUMMARY OF THE INVENTION

The present invention is intended for a method of introducing a dopant into a semiconductor substrate to activate the dopant.

According to one aspect of the present invention, the method comprises the steps of: (a) forming a thin film containing a dopant on a surface of the semiconductor substrate; (b) irradiating the semiconductor substrate with light from a continuous lighting lamp to heat the semiconductor substrate to a first temperature, thereby diffusing the dopant from the thin film into the surface of the semiconductor substrate; (c) turning off the continuous lighting lamp or decreasing an output from the continuous lighting lamp to decrease the temperature of the semiconductor substrate to a second temperature lower than the first temperature; and (d) irradiating the semiconductor substrate with a flash of light from a flash lamp to heat the surface of the semiconductor substrate to a third temperature higher than the second temperature, thereby activating the dopant.

The semiconductor substrate having the surface on which the thin film containing the dopant is formed is heated to the first temperature by irradiation with light from the halogen lamp, so that the dopant is diffused from the thin film into the surface of the semiconductor substrate. This achieves the introduction of the necessary and sufficient dopant into the surface of the semiconductor substrate without producing defects. The surface of the semiconductor substrate is heated to the third temperature by further irradiating the semiconductor substrate with a flash of light from the flash lamp, so that the dopant is activated. This achieves a high activation rate while suppressing the excessive diffusion of the dopant.

Preferably, the pressure in a chamber for receiving the semiconductor substrate therein is decreased to not greater than 13330 Pa before the step (b).

The heating treatment of the semiconductor substrate is performed in a low oxygen atmosphere. This provides a high activation rate more effectively.

Preferably, the thin film is a PSG film or a BSG film; the step (b) is performed in a hydrogen-containing atmosphere; and the step (d) is performed in a hydrogen-free atmosphere.

In the step (b), the dopant is diffused efficiently from the thin film into the semiconductor substrate. In the step (d), the excessive diffusion of the dopant is suppressed.

The present invention is also intended for a method of heating a semiconductor substrate having a surface on which a thin film containing a dopant is formed to introduce the dopant into the semiconductor substrate and activate the dopant.

According to another aspect of the present invention, the method comprises the steps of: (a) irradiating the semiconductor substrate with light from a continuous lighting lamp to heat the semiconductor substrate to a first temperature, thereby diffusing the dopant from the thin film into the surface of the semiconductor substrate; (b) turning off the continuous lighting lamp or decreasing an output from the continuous lighting lamp to decrease the temperature of the semiconductor substrate to a second temperature lower than the first temperature; and (c) irradiating the semiconductor substrate with a flash of light from a flash lamp to heat the surface of the semiconductor substrate to a third temperature higher than the second temperature, thereby activating the dopant.

It is therefore an object of the present invention to introduce a necessary and sufficient dopant without producing any defect and to provide a high activation rate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 6 is a side view of the transfer mechanism;

FIG. 7 is a plan view showing an arrangement of halogen lamps;

FIG. 9 is a schematic view of a structure of the front surface of a semiconductor wafer on which a thin film containing a dopant is deposited;

FIG. 11 is a schematic view of a structure of the front surface of the semiconductor wafer into which the dopant is introduced;

FIG. 12 is a graph showing a dopant concentration profile at the time that the thin film containing the dopant is deposited;

FIG. 14 is a graph showing a dopant concentration profile at the time that flash heating is performed using flash lamps.

DESCRIPTION OF THE PREFERRED EMBODIMENTS

Preferred embodiments according to the present invention will now be described in detail with reference to the drawings.

First Preferred Embodiment

Figure 1:
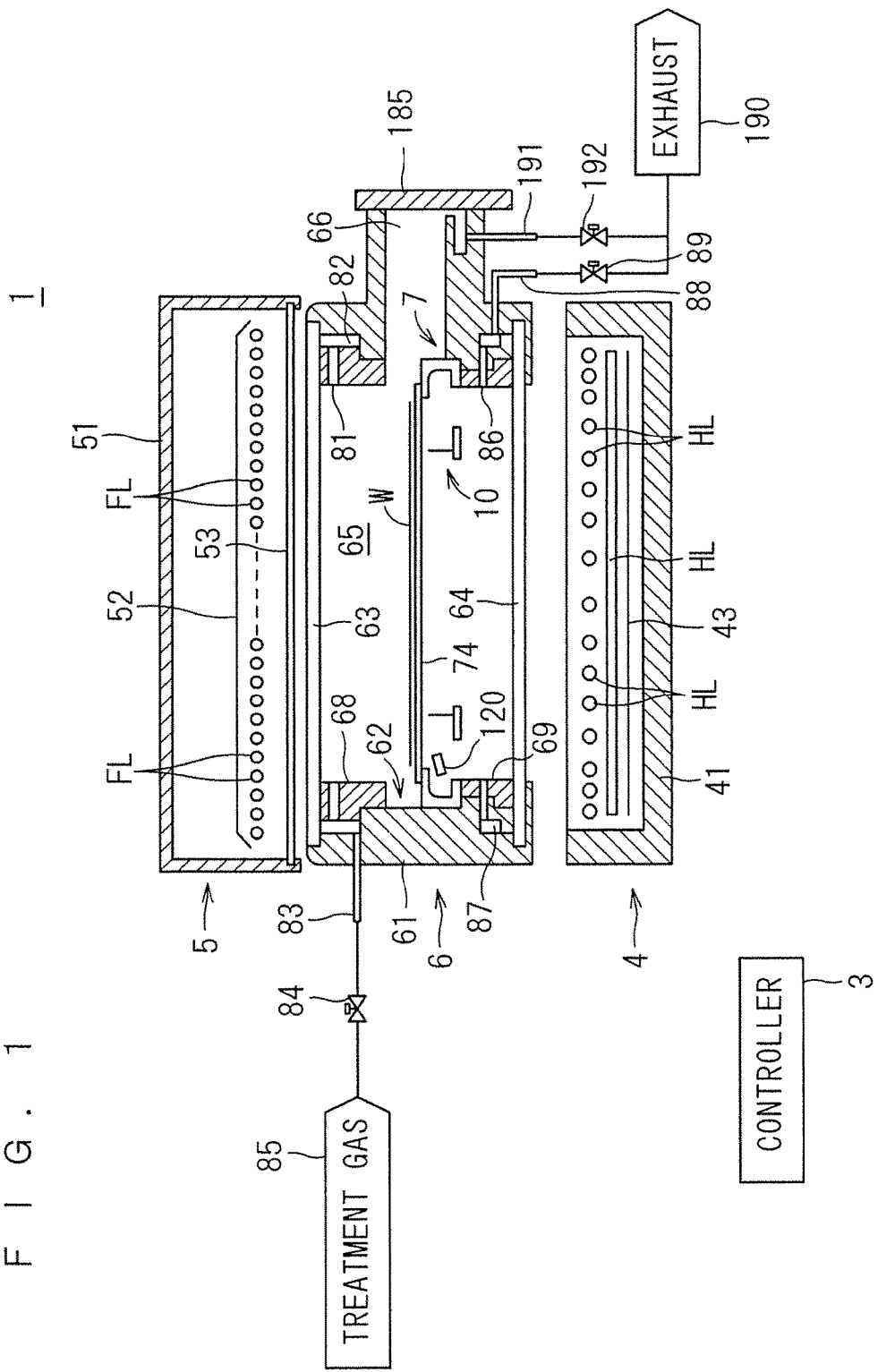
FIG. 1 is a longitudinal sectional view showing a configuration of a heat treatment apparatus used for a dopant introduction method and a heat treatment method according to the present invention.

First, a heat treatment apparatus which performs a heat treatment required when performing a dopant introduction method according to the present invention will be described. FIG. 1 is a longitudinal sectional view showing a configuration of a heat treatment apparatus 1 used for the dopant introduction method and a heat treatment method according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

A vacuum pump and a utility exhaust system in a factory in which the heat treatment apparatus 1 is installed may be used as the exhaust part 190. When a vacuum pump is employed as the exhaust part 190 to exhaust the atmosphere provided in the heat treatment space 65 which is an enclosed space while no gas is supplied from the gas supply opening 81 by closing the valve 84, the atmosphere provided in the chamber 6 is reduced in pressure to a vacuum atmosphere. When the vacuum pump is not used as the exhaust part 190, the pressure of the atmosphere provided in the chamber 6 is reduced to a pressure lower than atmospheric pressure by exhausting the atmosphere provided in the heat treatment space 65 while the gas is not supplied from the gas supply opening 81.

Figure 2:
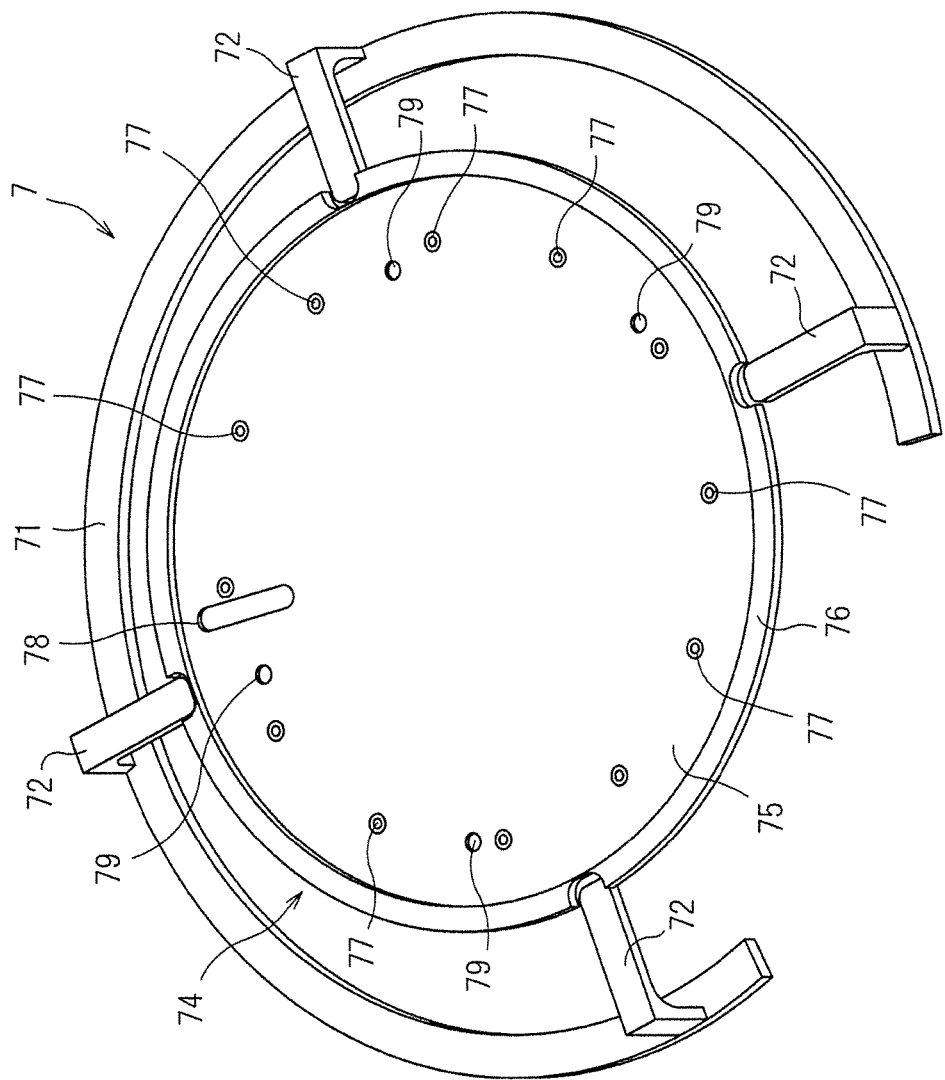
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
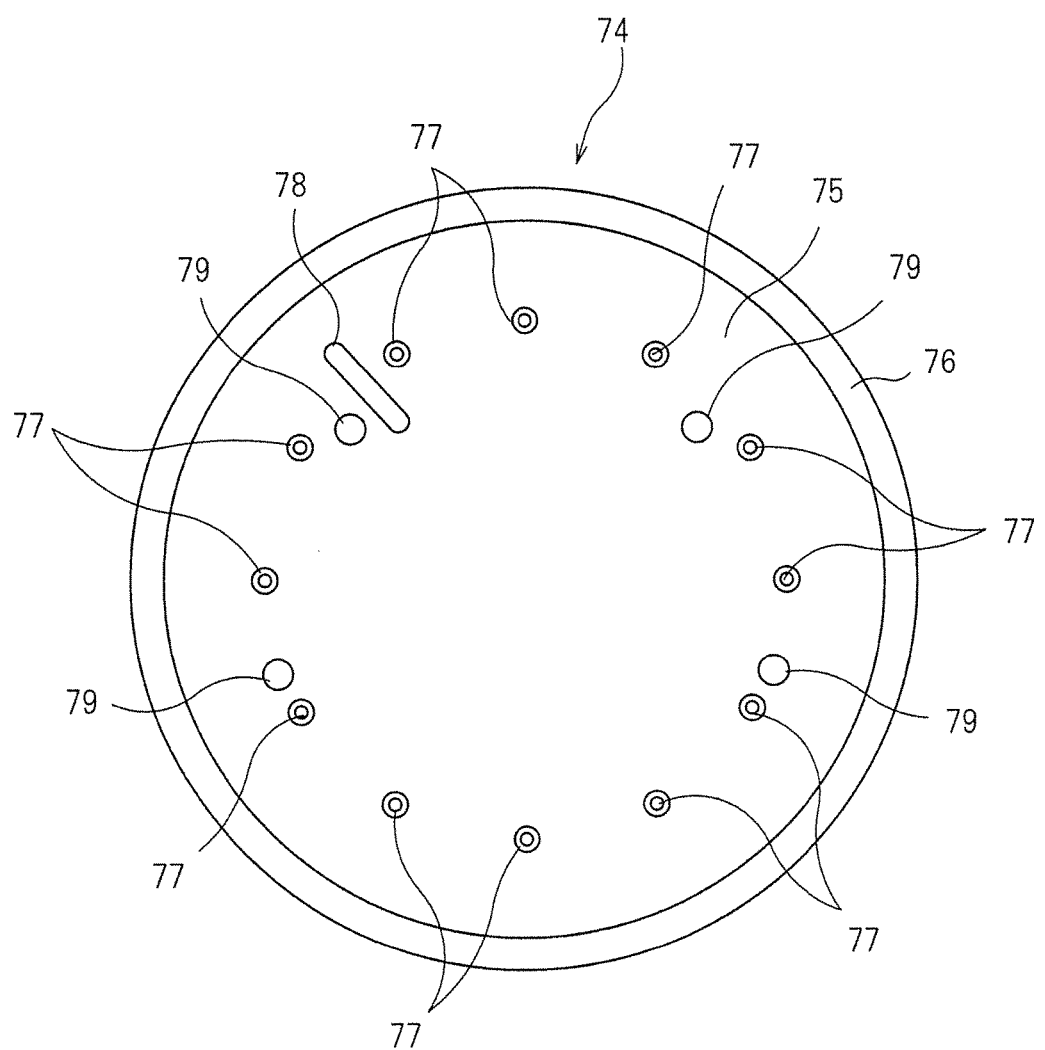
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W held by the susceptor 74. Specifically, the radiation thermometer 120 receives the radiation emitted from the lower surface of the semiconductor wafer W held by the susceptor 74 through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
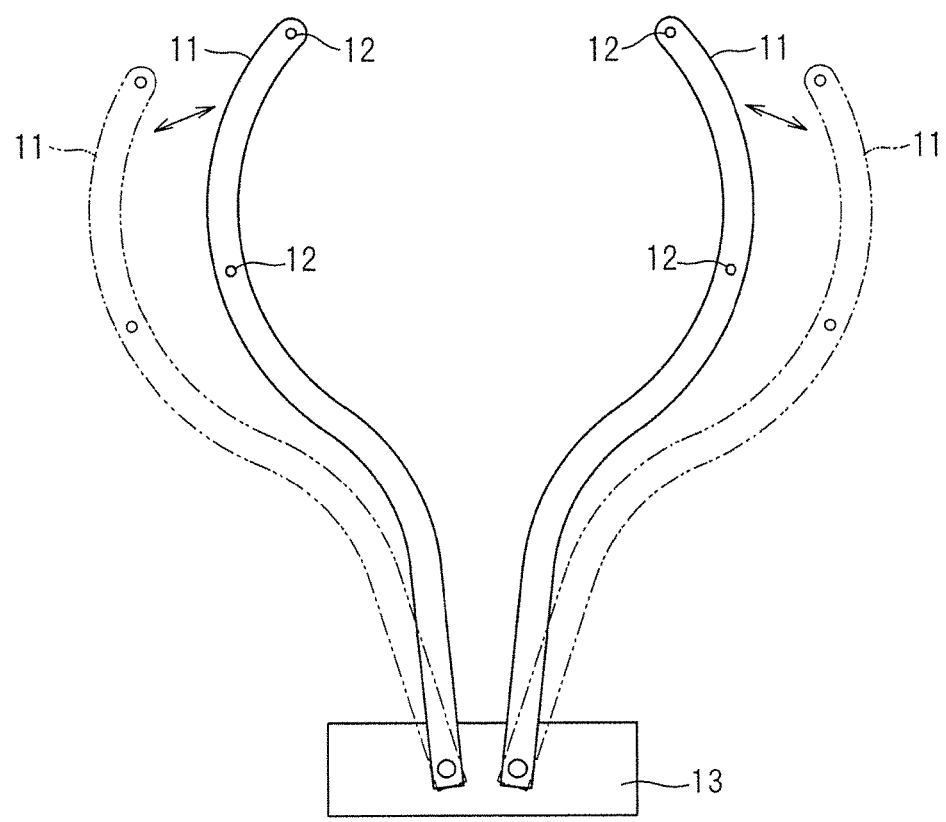
FIG. 5 is a plan view of a transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Figure 8:
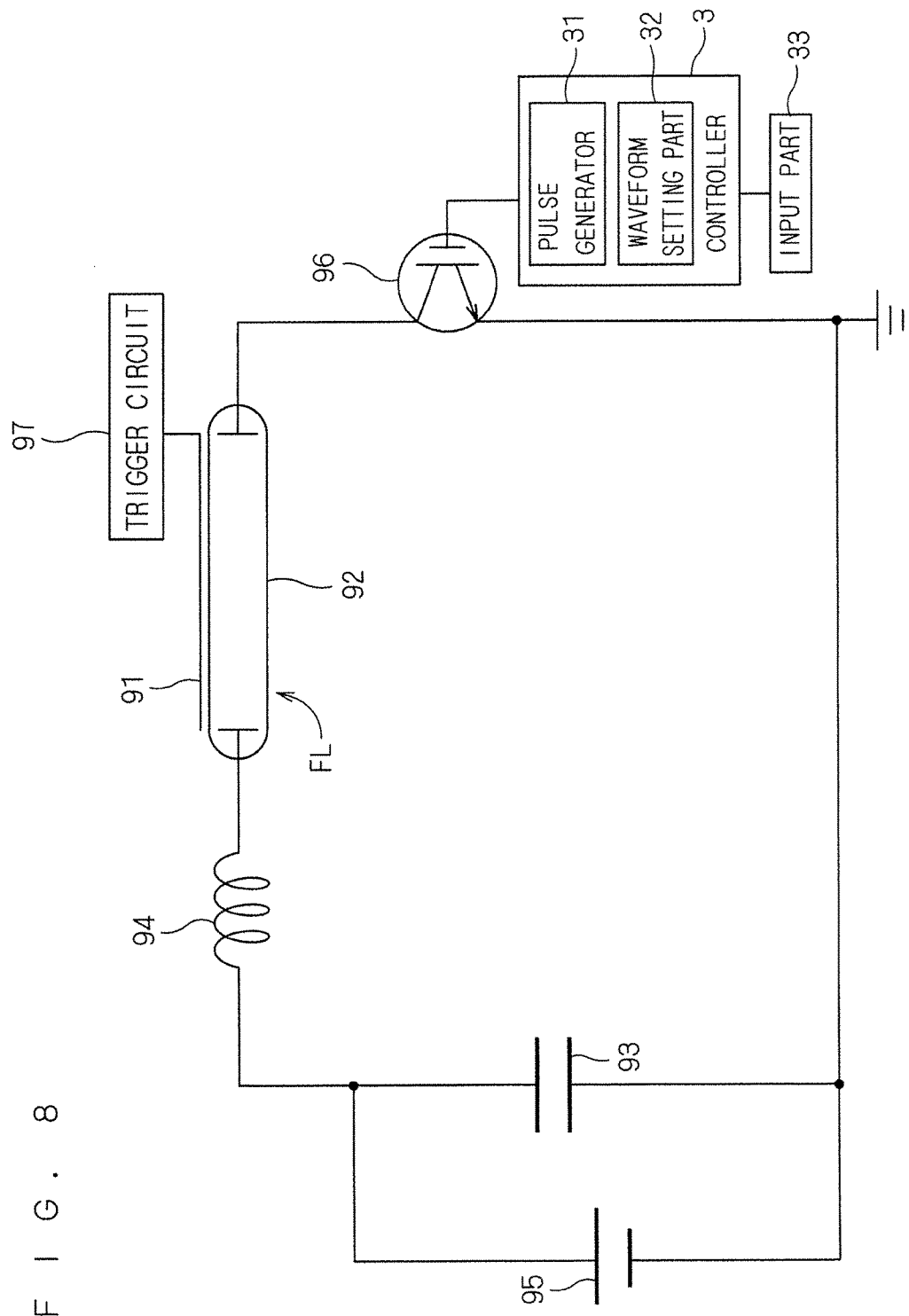
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode

91. The timing of the voltage application from the trigger circuit 97 to the trigger electrode 91 is under the control of the controller 3.

The IGBT 96 is a bipolar transistor which includes a MOSFET (Metal Oxide Semiconductor Field effect transistor) incorporated in the gate portion thereof, and is also a switching element suitable for handling a large amount of power. The pulse generator 31 in the controller 3 applies the pulse signal to the gate of the IGBT 96. When a voltage ("High" voltage) not less than a predetermined level is applied to the gate of the IGBT 96, the IGBT 96 turns on. When a voltage ("Low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken, so that the current flowing through the flash lamp FL is on-off controlled.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

The driving circuit as shown in FIG. 8 is provided individually for each of the flash lamps FL provided in the flash heating part 5. In the present preferred embodiment, 30 driving circuits each as shown in FIG. 8 are provided in corresponding relation to the 30 flash lamps FL arranged in a plane. Thus, the current flowing through each of the 30 flash lamps FL is individually on-off controlled by the corresponding IGBT 96.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, the dopant introduction method and the heat treatment method according to the present invention will be described. The semiconductor substrate to be treated in the present preferred embodiment is a silicon (Si) semiconductor wafer W, and a dopant is introduced into the silicon semiconductor wafer W to activate the dopant.

First, a thin film containing a dopant is deposited on the front surface of the silicon semiconductor wafer W. FIG. 9 is a schematic view of a structure of the front surface of the semiconductor wafer W on which the thin film containing the dopant is deposited. Prior to the dopant introduction method according to the present invention, a gate electrode 102 is formed on the front surface of the silicon semiconductor wafer W, with a gate insulator film 101 therebetween. A thin film 21 containing a dopant is deposited on regions of a source and a drain positioned on opposite sides of the gate electrode 102. The thin film 21 may be a film containing a dopant such as phosphorus (P) and boron (B). The thin film 21 may be a film evaporated by CVD and the like, a film applied by spin coating and the like, or a monoatomic layer of a dopant formed by wet processing. The thin film 21 according to the present preferred embodiment is a PSG (Phosphorus Silicate Glass) film that is a film of silicon dioxide ($SiO_2$) containing phosphorus (P) as a dopant. The thin film 21 of PSG is deposited on the front surface of the semiconductor wafer W by CVD using a mixture of a gas for the deposition of the silicon dioxide and a source gas containing phosphorus, for example. The process of depositing the thin film 21 is performed by a deposition apparatus different from the aforementioned heat treatment apparatus 1.

FIG. 12 is a graph showing a dopant concentration profile at the time that the thin film 21 containing the dopant is deposited. In FIG. 12, the abscissa represents the depth from the front surface of the semiconductor wafer W, and the ordinate represents the concentration of the dopant. As shown in FIG. 12, the dopant is not diffused in the semiconductor wafer W but is present in a high concentration only in the thin film 21 at the time that the thin film 21 is deposited.

As shown in FIG. 12, the dopant is present at a small distance from the front surface (depth 0) of the semiconductor wafer W. This is because a thin silicon native oxide film ($SiO_2$) is formed on the front surface of the semiconductor wafer W prior to the deposition of the thin film 21 and the thin film 21 containing the dopant is deposited on the oxide film. Such a silicon oxide film is inevitably slightly formed at the time of the deposition of the thin film 21 even if the silicon oxide film is removed by etching and the like before the deposition of the thin film 21.

Next, the aforementioned heat treatment apparatus 1 performs a heat treatment on the semiconductor wafer W on which the thin film 21 containing the dopant is deposited. The heat treatment of the semiconductor wafer W by means of the heat treatment apparatus 1 will be described. A procedure for the treatment in the heat treatment apparatus 1 to be described below proceeds under the control of the controller 3 over the operating mechanisms of the heat treatment apparatus 1.

First, the gate valve 185 is opened to open the transport opening 66. A transport robot outside the heat treatment apparatus 1 transports a semiconductor wafer W through the transport opening 66 into the heat treatment space 65 of the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where the thin film 21 is deposited is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the transport opening 66 is closed by the gate valve 185 to cause the heat treatment space 65 to become an enclosed space, the atmosphere in the chamber 6 is controlled. Specifically, the valve 84 is opened, so that the treatment gas is supplied through the gas supply opening 81 into the heat treatment space 65. In the present preferred embodiment, nitrogen gas ($N_2$) is supplied as the treatment gas into the heat treatment space 65 of the chamber 6. Also, the valve 89 is opened, so that the gas within the chamber 6 is exhausted through the gas exhaust opening 86. This causes the treatment gas supplied from an upper portion of the heat treatment space 65 of the chamber 6 to flow downwardly and then to be exhausted from a lower portion of the heat treatment space 65, so that the atmosphere in the heat treatment space 65 is replaced with a nitrogen atmosphere. The gas within the chamber 6 is exhausted also through the transport opening 66 by opening the valve 192. Further, the exhaust mechanism not shown exhausts an atmosphere near the drivers of the transfer mechanism 10.

Figure 10:
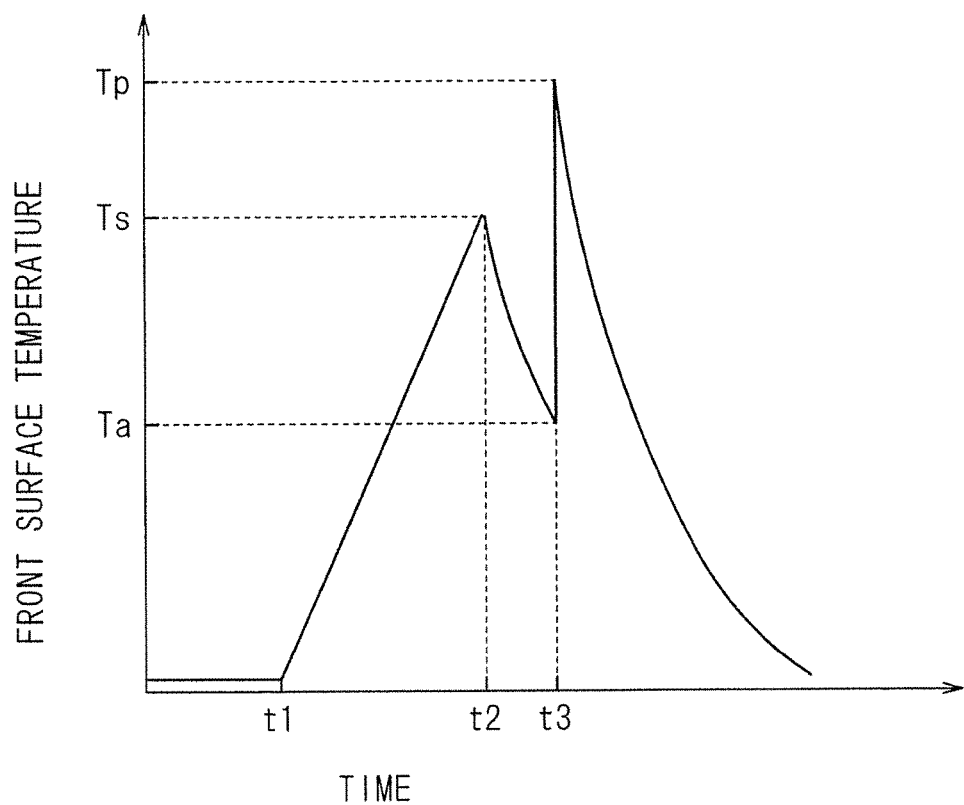
FIG. 10 is a graph showing changes in the temperature of the front surface of the semiconductor wafer according to a first preferred embodiment of the present invention.

FIG. 10 is a graph showing changes in the temperature of the front surface of the semiconductor wafer W according to a first preferred embodiment of the present invention. After the atmosphere in the chamber 6 is replaced with the nitrogen atmosphere and the semiconductor wafer W is held in a horizontal attitude from below by the susceptor 74 of the holder 7, the 40 halogen lamps HL in the halogen heating part 4 turn on simultaneously at time t1 to start rapid heating (RTA or Rapid Thermal Annealing) of the semiconductor wafer W. Halogen light emitted from the halogen lamps HL is transmitted through the lower chamber window 64 and the susceptor 74 both made of quartz, and impinges upon the back surface of the semiconductor wafer W. By receiving halogen light irradiation from the halogen lamps HL, the semiconductor wafer W is rapidly heated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 120 when the halogen lamps HL perform the rapid heating. Specifically, the radiation thermometer 120 receives infrared radiation emitted from the back surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined first peak temperature Ts (first temperature) or not. In other words, the controller 3 effects feedback control of the output from the halogen lamps HL so that the temperature of the semiconductor wafer W is equal to the first peak temperature Ts, based on the value measured with the radiation thermometer 120. The rate of increase in temperature of the semiconductor wafer W during the rapid heating using the halogen lamps HL is not less than 50° C./sec. The first peak temperature Ts reached using the halogen lamps HL is in the range of 950 to 1100° C.

After the temperature of the semiconductor wafer W reaches the first peak temperature Ts at time t2, the controller 3 maintains the temperature of the semiconductor wafer W at the first peak temperature Ts for on the order of 0.5 to 5 seconds. Specifically, at the time t2 when the temperature of the semiconductor wafer W measured with the radiation thermometer 120 reaches the first peak temperature Ts, the controller 3 controls the output from the halogen lamps HL to maintain the temperature of the semiconductor wafer W at approximately the first peak temperature Ts for on the order of 0.5 to 5 seconds.

During the rapid heating using the halogen lamps HL, the temperature of the entire semiconductor wafer W is increased uniformly to the first peak temperature Ts. In the stage of the rapid heating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W.

The semiconductor wafer W on which the thin film 21 containing the dopant is deposited is rapidly heated to the first peak temperature Ts by the irradiation with light from the halogen lamps HL. This causes the dopant to diffuse from the thin film 21 into the front surface of the semiconductor wafer W. As mentioned above, the silicon oxide film is inevitably formed on the front surface of the semiconductor wafer W, and the thin film 21 containing the dopant is deposited on the oxide film. However, the silicon oxide film is extremely thin, so that the rapid heating using the halogen lamps HL is capable of diffusing the sufficient dopant from the thin film 21 through the silicon oxide film into the front surface of the semiconductor wafer W.

As a result, the dopant is introduced into the source and drain regions of the semiconductor wafer W to form a dopant layer. FIG. 11 is a schematic view of a structure of the front surface of the semiconductor wafer W into which the dopant is introduced. The semiconductor wafer W is rapidly heated to the first peak temperature Ts by the irradiation with light from the halogen lamps HL, whereby the dopant is diffused from the thin film 21 containing the dopant through the silicon oxide film into the front surface of the semiconductor wafer W. Thus, a dopant layer 22 is formed near the front surface of the semiconductor wafer W.

Figure 13:
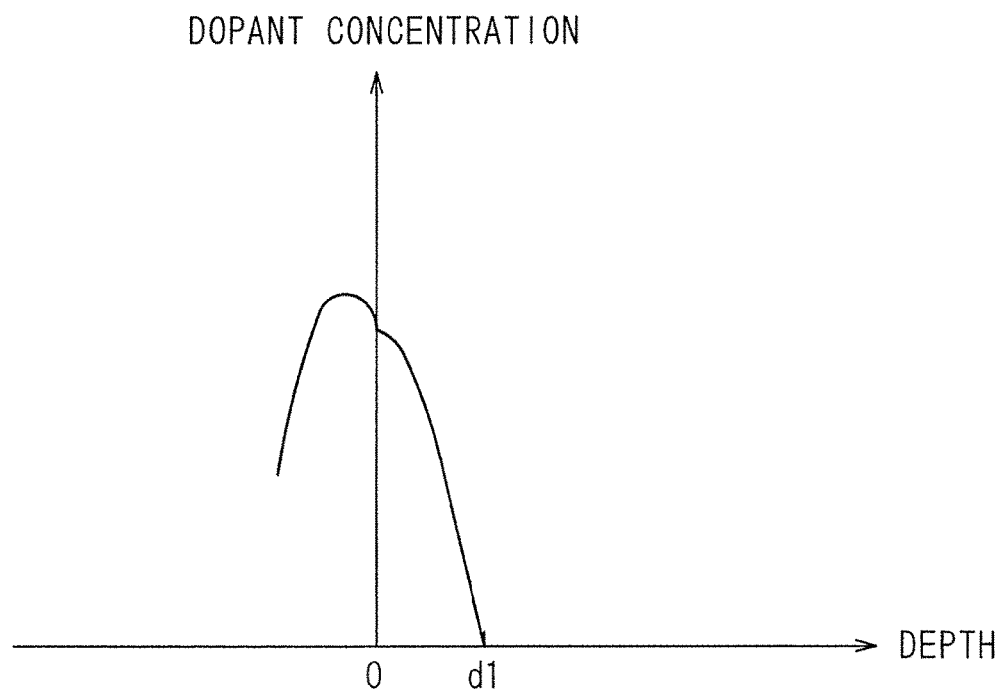
FIG. 13 is a graph showing a dopant concentration profile at the time that rapid heating is performed using the halogen lamps.

FIG. 13 is a graph showing a dopant concentration profile at the time that the rapid heating is performed using the halogen lamps HL. By the rapid heating using the halogen lamps HL, the dopant is diffused from the thin film 21 through the silicon oxide film to a depth d1 as measured from the front surface of the semiconductor wafer W. The depth d1 is equal to the thickness of the dopant layer 22. The dopant concentration gradually decreases from the front surface of the semiconductor wafer W toward the depth d1.

After a predetermined time period (0.5 to 5 seconds) has elapsed since the temperature of the semiconductor wafer W reached the first peak temperature Ts at the time t2, the 40 halogen lamps HL of the halogen heating part 4 turn off. The turning off of the halogen lamps HL causes the temperature of the semiconductor wafer W to decrease rapidly from the first peak temperature Ts. The radiation thermometer 120 measures the temperature of the semiconductor wafer W which is on the decrease. The result of measurement is transmitted to the controller 3. The controller 3 monitors whether the temperature of the semiconductor wafer W is decreased to a predetermined cooling temperature Ta (second temperature) or not, based on the result of measurement with the radiation thermometer 120. The rate of decrease in temperature of the semiconductor wafer W during the temperature decrease is not less than 50° C./sec. The cooling temperature Ta is of course lower than the first peak temperature Ts, and is 850° C. or below.

At time t3 when the temperature of the semiconductor wafer W is decreased to the cooling temperature Ta, the front surface of the semiconductor wafer W is irradiated with flashes of light from the flash lamps FL of the flash heating part 5. For the flash irradiation from each of the flash lamps FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32. As a result, the pulse signal having the set waveform is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

In this manner, the 30 flash lamps FL of the flash heating part 5 emit light, so that the front surface of the semiconductor wafer W held by the holder 7 is irradiated with flashes of light. If such a flash lamp FL emits light without using the IGBT 96, the electrical charges stored in the capacitor 93 are consumed momentarily by emitting light only once, so that the output waveform from the flash lamp FL exhibits a single simple pulse having a width on the order of 0.1 to 10 milliseconds. On the other hand, the IGBT 96 serving as a switching element is connected in the circuit and the pulse signal is outputted to the gate of the IGBT 96 according to the present preferred embodiment. Thus, the IGBT 96 intermittently supplies the electrical charges from the capacitor 93 to the flash lamp FL to effect on-off control of the current flowing through the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current flowing through the circuit reaches exactly zero, the next pulse is applied to the gate of the IGBT 96 to increase the current value again. For this reason, the emission output never reaches exactly zero even while the flash lamp FL repeatedly flashes on and off.

The IGBT 96 effects on-off control of the current flowing through the flash lamp FL to freely define the light emission pattern (time waveform of light emission outputs) of the flash lamp FL, thereby freely adjusting the light emission time and the light emission intensity. The on-off driving pattern of the IGBT 96 is defined by the time interval equivalent to the pulse width and the time interval between the pulses inputted from the input part 33. That is, the incorporation of the IGBT 96 into the driving circuit for the flash lamp FL allows the light emission pattern of the flash lamp FL to be freely defined only by suitably setting the time interval equivalent to the pulse width and the time interval between the pulses inputted from the input part 33.

Specifically, for example, increasing the ratio of the time interval equivalent to the pulse width inputted from the input part 33 to the time interval between the pulses increases the current flowing through the flash lamp FL to increase the light emission intensity. On the other hand, decreasing the ratio of the time interval equivalent to the pulse width inputted from the input part 33 to the time interval between the pulses decreases the current flowing through the flash lamp FL to decrease the light emission intensity. When the ratio of the time interval equivalent to the pulse width inputted from the input part 33 to the time interval between the pulses is appropriately controlled, the light emission intensity of the flash lamp FL is maintained constant. Further, increasing the total time of a combination of the time interval equivalent to the pulse width and the time interval between the pulses inputted from the input part 33 causes the current to continue flowing through the flash lamp FL for a relatively long time, thereby increasing the light emission time of the flash lamp FL. In the present preferred embodiment, the light emission time of the flash lamp FL is in the range of 0.1 to 100 milliseconds.

In this manner, the irradiation of the front surface of the semiconductor wafer W with flashes of light from the flash lamps FL for a time period in the range of 0.1 to 100 milliseconds achieves the flash heating of the semiconductor wafer W. The irradiation with extremely short and intense flashes of light for a time period in the range of 0.1 to 100 milliseconds momentarily increases the temperature of the front surface of the semiconductor wafer W including the thin film 21 to a second peak temperature Tp (third temperature). The second peak temperature Tp at the time of the flash heating is higher than the first peak temperature Ts at the time of the rapid heating using the halogen lamps HL, and is 1200° C. or above.

Irradiating the semiconductor wafer W with flashes of light for a time period in the range of 0.1 to 100 milliseconds to momentarily heat the front surface of the semiconductor wafer W to the second peak temperature Tp activates the dopant in the dopant layer 22 formed in the source and drain regions of the semiconductor wafer W. The time period for which the temperature of the front surface of the semiconductor wafer W is increased from the cooling temperature Ta to the second peak temperature Tp by the flash irradiation and is maintained at the second peak temperature Tp is on the order of milliseconds.

FIG. 14 is a graph showing a dopant concentration profile at the time that the flash heating is performed using the flash lamps FL. The front surface of the semiconductor wafer W is momentarily heated to the second peak temperature Tp by the flash irradiation from the flash lamps FL, so that the dopant in the dopant layer 22 is activated. This heating, however, is a heat treatment for an extremely short time period on the order of milliseconds to suppress the further diffusion of the dopant. This avoids the excessive diffusion of the dopant from the thin film 21 into the front surface of the semiconductor wafer W to prevent the dopant diffused in the semiconductor wafer W at the time of the rapid heating using the halogen lamps HL from diffusing more deeply to greater than the depth d1.

In the flash heating, the time period for the flash irradiation is an extremely short time period of less than one second. For this reason, the temperature of the front surface of the semiconductor wafer W increases momentarily to the second peak temperature Tp and immediately thereafter decreases rapidly. The radiation thermometer 120 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W. After the completion of the heat treatment of the semiconductor wafer W in the heat treatment apparatus 1, the thin film 21 may be removed from the front surface of the semiconductor wafer W.

In the first preferred embodiment, the semiconductor wafer W having the front surface on which the thin film 21 containing the dopant is deposited is rapidly heated to the first peak temperature Ts by the irradiation with light from the halogen lamps HL, so that the dopant is diffused from the thin film 21 into the front surface of the semiconductor wafer W. Although the silicon oxide film is inevitably present at the interface between the thin film 21 and the front surface of the semiconductor wafer W, the rapid heating using the halogen lamps HL is capable of diffusing the necessary and sufficient dopant from the thin film 21 through the silicon oxide film into the front surface of the semiconductor wafer W. Also, the dopant is introduced into the front surface of the semiconductor wafer W by the thermal diffusion from the thin film 21 containing the dopant. This eliminates the danger of damages to the inside of the semiconductor wafer W as in the ion implantation to prevent the occurrence of defects such as crystal defects. Thus, the rapid heating of the semiconductor wafer W on which the thin film 21 containing the dopant is deposited by means of the halogen lamps HL achieves the introduction of the necessary and sufficient dopant into the front surface of the semiconductor wafer W without producing defects.

Then, the semiconductor wafer W into which the dopant is introduced by the rapid heating is irradiated with flashes of light from the flash lamps FL. This heats the front surface of the semiconductor wafer W to the second peak temperature Tp to activate the dopant. The flash irradiation which is extremely short in irradiation time achieves a high activation rate without excessive diffusion of the dopant.

Further, in the first preferred embodiment, the halogen lamps HL are turned off after the rapid heating to decrease the temperature of the semiconductor wafer W once to the cooling temperature Ta before the flash irradiation. As a result, this decreases the thermal budget from the rapid heating to the flash heating to effectively prevent the dopant from diffusing excessively.

Second Preferred Embodiment

Next, a second preferred embodiment according to the present invention will be described. The heat treatment apparatus 1 according to the second preferred embodiment is identical in overall configuration with that according to the first preferred embodiment. The procedure for the treatment of a semiconductor wafer W in the heat treatment apparatus 1 according to the second preferred embodiment is also substantially similar to that according to the first preferred embodiment. The second preferred embodiment differs from the first preferred embodiment in that the heat treatment process is performed in a reduced-pressure condition.

Although the heat treatment process of the semiconductor wafer W is performed in an ordinary-pressure nitrogen atmosphere in the first preferred embodiment, the rapid heating and flash heating of the semiconductor wafer W are performed in a reduced-pressure condition of not greater than 100 Torr (approximately 13330 Pa) in the second preferred embodiment. Specifically, the pressure in the heat treatment space 65 of the chamber 6 for receiving the semiconductor wafer W therein is reduced to not greater than 13330 Pa prior to the start of the rapid heating using the halogen lamps HL. Then, the rapid heating using the halogen lamps HL and the flash heating using the flash lamps FL which are similar to those in the first preferred embodiment are performed in the reduced-pressure atmosphere.

It has been known that residual oxygen present in the chamber 6 decreases the activation rate of the dopant introduced into the semiconductor wafer W. By performing the heat treatment process similar to that in the first preferred embodiment in a reduced-pressure condition of not greater than 13330 Pa as in the second preferred embodiment, the rapid heating and flash heating of the semiconductor wafer W are performed in a low oxygen atmosphere. This provides a high activation rate with higher reliability in addition to effects similar to those of the first preferred embodiment.

Third Preferred Embodiment

Next, a third preferred embodiment according to the present invention will be described. The heat treatment apparatus 1 according to the third preferred embodiment is identical in overall configuration with that according to the first preferred embodiment. The procedure for the treatment of a semiconductor wafer W in the heat treatment apparatus 1 according to the third preferred embodiment is also substantially similar to that according to the first preferred embodiment. The thin film 21 of PSG is deposited on the front surface of the semiconductor wafer W. The third preferred embodiment differs from the first preferred embodiment in atmosphere in the chamber 6 during the execution of the heat treatment process.

Although the heat treatment process of the semiconductor wafer W is performed in an ordinary-pressure nitrogen atmosphere in the first preferred embodiment, the rapid heating using the halogen lamps HL is performed in a hydrogen-containing atmosphere and the flash heating using the flash lamps FL is performed in a hydrogen-free atmosphere in the third preferred embodiment. Specifically, a gas mixture of nitrogen gas ($N_2$) and hydrogen gas ($H_2$) is supplied as the treatment gas into the heat treatment space 65 of the chamber 6 to form a hydrogen-containing atmosphere in the heat treatment space 65 prior to the start of the rapid heating using the halogen lamps HL. In the hydrogen-containing atmosphere, the semiconductor wafer W on which the thin film 21 containing the dopant is deposited is rapidly heated to the first peak temperature Ts by the irradiation with light from the halogen lamps HL, so that the dopant is diffused from the thin film 21 into the front surface of the semiconductor wafer W. In the third preferred embodiment, the diffusion coefficient of phosphorus in the thin film 21 of PSG is high because the semiconductor wafer W is rapidly heated to the first peak temperature Ts in the hydrogen-containing atmosphere. Thus, the rapid heating of the semiconductor wafer W to the first peak temperature Ts through the use of the irradiation with light from the halogen lamps HL achieves the efficient diffusion of the dopant from the thin film 21 into the semiconductor wafer W.

Next, the halogen lamps HL turn off. Then, while the temperature of the semiconductor wafer W is on the decrease from the first peak temperature Ts to the cooling temperature Ta, the treatment gas supplied into the chamber 6 is changed from the gas mixture of nitrogen gas and hydrogen gas to only nitrogen gas, so that the atmosphere in the heat treatment space 65 of the chamber 6 is replaced with a nitrogen atmosphere. In the hydrogen-free nitrogen atmosphere, the front surface of the semiconductor wafer W is heated to the second peak temperature Tp by irradiating the semiconductor wafer W with flashes of light from the flash lamps FL, so that the dopant is activated. The flash heating in the hydrogen-free atmosphere suppresses the excessive diffusion of the dopant from the thin film 21 of PSG into the semiconductor wafer W.

Modifications

While the preferred embodiments according to the present invention have been described hereinabove, various modifications of the present invention in addition to those described above may be made without departing from the scope and spirit of the invention. For example, the halogen lamps HL are turned off after the rapid heating to decrease the temperature of the semiconductor wafer W to the cooling temperature Ta in the aforementioned preferred embodiments. In place of this process, outputs from the halogen lamps HL may be decreased to decrease the temperature of the semiconductor wafer W from the first peak temperature Ts to the cooling temperature Ta.

The thin film 21 of PSG according to the aforementioned preferred embodiments may be a BSG (Boron Silicate Glass) film that is a film of silicon dioxide containing boron (B) as a dopant. In particular, in the third preferred embodiment, the diffusion coefficient of boron in the thin film 21 is high even when the thin film 21 of BSG is used. This achieves the efficient diffusion of the dopant from the thin film 21 into the semiconductor wafer W during the rapid heating using the halogen lamps HL.

In the second preferred embodiment, after the pressure in the chamber 6 is reduced once to not greater than 13330 Pa prior to the rapid heating using the halogen lamps HL, nitrogen gas may be supplied into the chamber 6 to return the pressure in the chamber 6. Thus, the rapid heating and the flash heating of the semiconductor wafer W are also performed in a low oxygen atmosphere. This prevents the decrease in activation rate of the dopant.

The semiconductor substrate to be treated is the silicon semiconductor wafer W in the aforementioned preferred embodiments, but is not limited to this. The semiconductor substrate to be treated may be a semiconductor wafer W of germanium (Ge) or silicon-germanium (SiGe). Alternatively, the semiconductor substrate to be treated may be a wafer of a compound semiconductor such as gallium arsenide (GaAs).

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to heat the semiconductor wafer W to the first peak temperature Ts (first temperature) and to maintain the temperature of the semiconductor wafer W at approximately the first peak temperature Ts for on the order of 0.5 to 5 seconds. The present invention, however, is not limited to this. In place of the halogen lamps HL, arc lamps such as discharge type xenon arc lamps may be used as similar continuous lighting lamps to similarly heat the semiconductor wafer W.

While the invention has been described in detail, the foregoing description is in all aspects illustrative and not restrictive. It is understood that numerous other modifications and variations can be devised without departing from the scope of the invention.

What is claimed is:

1. A method of introducing a dopant into a semiconductor substrate to activate the dopant, said method comprising the steps of:
    (a) forming a thin film containing a dopant on a surface of said semiconductor substrate;
    (b) irradiating said semiconductor substrate with light from a continuous lighting lamp to heat said semiconductor substrate to a first temperature, thereby diffusing said dopant from said thin film into the surface of said semiconductor substrate;
    (c) turning off said continuous lighting lamp or decreasing an output from said continuous lighting lamp to decrease the temperature of said semiconductor substrate to a second temperature lower than said first temperature; and
    (d) irradiating said semiconductor substrate with a flash of light from a flash lamp to heat the surface of said semiconductor substrate to a third temperature higher than said second temperature, thereby activating said dopant.

2. The method according to claim 1, wherein
said third temperature is higher than said first temperature.

3. The method according to claim 1, wherein
the pressure in a chamber for receiving said semiconductor substrate therein is decreased to not greater than 13330 Pa before said step (b).

4. The method according to claim 1, wherein:
said thin film is a PSG film or a BSG film;
said step (b) is performed in a hydrogen-containing atmosphere; and
said step (d) is performed in a hydrogen-free atmosphere.

5. A method of heating a semiconductor substrate having a surface on which a thin film containing a dopant is formed to introduce the dopant into the semiconductor substrate and activate the dopant, said method comprising the steps of:
    (a) irradiating said semiconductor substrate with light from a continuous lighting lamp to heat said semiconductor substrate to a first temperature, thereby diffusing said dopant from said thin film into the surface of said semiconductor substrate;
    (b) turning off said continuous lighting lamp or decreasing an output from said continuous lighting lamp to decrease the temperature of said semiconductor substrate to a second temperature lower than said first temperature; and
    (c) irradiating said semiconductor substrate with a flash of light from a flash lamp to heat the surface of said semiconductor substrate to a third temperature higher than said second temperature, thereby activating said dopant.

* * * * *